(12) United States Patent
Zhou

(10) Patent No.: US 9,947,272 B2
(45) Date of Patent: Apr. 17, 2018

(54) ORGANIC LIGHT-EMITTING DIODE DISPLAY DEVICE

(71) Applicant: EverDisplay Optronics (Shanghai) Limited, Shanghai (CN)

(72) Inventor: Xingyu Zhou, Shanghai (CN)

(73) Assignee: EverDisplay Optronics (Shanghai) Limited, Shanghai (CN)

( * ) Notice: Subject to any disclaimer, the term of this patent is extended or adjusted under 35 U.S.C. 154(b) by 0 days.

(21) Appl. No.: 15/017,345

(22) Filed: Feb. 5, 2016

(65) Prior Publication Data

US 2017/0330512 A1 Nov. 16, 2017

(30) Foreign Application Priority Data

Jan. 29, 2015 (CN) .......................... 2015 1 0047411

(51) Int. Cl.
  *G09G 3/325* (2016.01)
  *G09G 3/3258* (2016.01)
  *H01L 27/15* (2006.01)
  *G09G 3/3266* (2016.01)
  *G09G 3/3275* (2016.01)

(52) U.S. Cl.
  CPC ........... *G09G 3/3258* (2013.01); *G09G 3/325* (2013.01); *H01L 27/156* (2013.01); *G09G 3/3266* (2013.01); *G09G 3/3275* (2013.01)

(58) Field of Classification Search
  CPC ............................. G09G 3/325; G09G 3/3275
  See application file for complete search history.

(56) References Cited

U.S. PATENT DOCUMENTS

2006/0210012 A1* 9/2006 Yamaguchi ............ G11C 19/00
  377/64
2012/0050234 A1* 3/2012 Jang ..................... G09G 3/3225
  345/204

* cited by examiner

*Primary Examiner* — Shaheda Abdin
(74) *Attorney, Agent, or Firm* — Wang Law Firm, Inc.

(57) ABSTRACT

An OLED display device includes an array of pixel units. Each pixel unit includes a pixel driving circuit and an OLED. The pixel units in each column is connected to a data line. The pixel units in each row is connected to a first scan line for selecting and activating pixel units to receive a data voltage provided by the data line. The pixel units in each row is connected to a second scan line for selecting and resetting pixel units. An emission control line connected to the pixel units in each odd-numbered row is connected to a first clock signal end. An emission control line connected to the pixel units in each even-numbered row is connected to a second clock signal end. Two emission control signals outputted by the first and second clock signal ends have the same period and have a stable phase difference between 90° and 180°.

19 Claims, 5 Drawing Sheets

ORGANIC LIGHT-EMITTING DIODE DISPLAY DEVICE

BACKGROUND OF THE INVENTION

The present invention relates to a display device and, more particularly, to an organic light-emitting diode (OLED) display device.

Due to the advantages of small volume, simple structure, self-illumination, high luminance, good picture quality, wide visual angle, low power consumption, and high speed response, organic light-emitting diode display devices receive wide attention and could possibly replace liquid crystals as the next generation of display technology.

FIG. 1 shows a conventional OLED display device. As shown in FIG. 1, the OLED display device includes an array of pixel units 10. Each row of pixel units 10 is connected to a first scan line $G_i$, a second scan line $G_{i-1}$, and an emission control line $E_i$ (i is an integer ranging from 1 to n). Each column of pixel units 10 is connected to a data line ($D_j$ (j is an integer ranging from 1 to m). FIG. 2 shows a currently available pixel driving circuit. Each pixel unit 10 includes the pixel driving circuit and an organic light-emitting diode. The pixel driving circuit includes a first scan end $S_c$ connected to the first scan line $G_i$, a second scan end $S_{c-1}$ connected to the second scan line $G_{i-1}$, a data signal end $D_{ata}$ connected to the data line $D_j$, and an emission control end $E_{mit}$ connected to the emission control line $E_i$. FIG. 3 is a waveform diagram of each control end of the pixel driving circuit of FIG. 2 during operation. As shown in FIG. 3, during operation of the pixel unit 10, the first scan line $G_i$ controls the pixel driving circuit through the first scan end $S_c$ to receive a data voltage from the data line $D_j$. Then, the emission control line $E_i$ controls the pixel driving circuit to convert the data voltage into a current to thereby activate the organic light-emitting diode to emit.

To permit the emission control lines $E_i$ to output predetermined signals to the pixel units 10, conventional OLED display devices generally include an emission control line driving module 13 to provide emission control signals to the emission control lines $E_i$. Conventionally, the emission control signal of an emission control line $E_i$ is different from the emission control signals of other emission control lines $E_i$. Thus, each emission control line $E_i$ needs an independent emission control line driving module 13 to provide the unique emission control signal, which occupies an area of the side frame of the OLED display device. Furthermore, as the area of the OLED display device increases, the number of the emission control line driving modules 13 for driving the respective the emission control lines $E_i$ and the driving power demand of the emission control line driving modules 13 are also increased. This increases the overall area of the emission control line driving modules 13, such that the width of the side frame of the OLED display device increases.

BRIEF SUMMARY OF THE INVENTION

An objective of the present invention is to provide an organic light-emitting diode display device to solve the problem of occupation of a large side frame area by the emission control line driving modules, thereby reducing the side frame width of the organic light-emitting diode display device.

To fulfill the above objective, the present invention provides an organic light-emitting diode (OLED) display device including an array of pixel units. Each pixel unit includes a pixel driving circuit and an organic light-emitting diode. The pixel units in each column of the array are connected to a data line providing a data voltage to the pixel units. The pixel units in each row of the array are connected to a first scan line for selecting and activating the pixel units to receive the data voltage. The pixel units in each row of the array are connected to a second scan line for selecting and resetting the pixel units. The pixel units in each row are connected to an emission control line that sends an emission control signal to the pixel units. The emission control line connected to the pixel units in each odd-numbered row of the array is connected to a first clock signal end. The emission control line connected to the pixel units in each even-numbered row of the array is connected to a second clock signal end. Two emission control signals outputted by the first and second clock signal ends have the same period and have a stable phase difference between 90° and 180°.

Another feature of the OLED display device is that each pixel unit enters a reset state under control by a second scan signal provided by the second scan line, and the data voltage stored in each pixel unit in the reset state is cleared.

A further feature of the OLED display device is that when the second scan signal provided by the second scan line is at a low level, each pixel unit selected by the second scan line enters the reset state.

Still another feature of the OLED display device is that when one of the pixel units is in the reset state, the emission control signal received by the one of the pixel units from the emission control line connected thereto is in an active state.

Yet another feature of the OLED display device is that when one of the pixel units is in the reset state, the voltage at two ends of the organic light-emitting diode of the one of the pixel units is smaller than a conductive threshold voltage of the organic light-emitting diode.

Still another feature of the OLED display device is that each pixel unit enter a data voltage writing state under control by a first scan signal provided by the first scan line, and each pixel unit in the data voltage writing state receives and stores the data voltage provided by the data line connected thereto.

Yet another feature of the OLED display device is that the pixel driving circuit of each pixel unit further includes a storage capacitor, and each pixel unit stores the data voltage from the data line in the storage capacitor thereof.

Still another feature of the OLED display device is that the pixel driving circuit of each pixel unit further includes a driving transistor, and when each pixel unit is in a data voltage writing procedure, the data voltage containing a threshold voltage of the driving transistor is stored in the storage capacitor thereof.

Yet another feature of the OLED display device is that when the first scan signal provided by the first scan line is at a low level, each pixel unit selected by the first scan line enters the data voltage writing state.

Still another feature of the OLED display device is that when one of the pixel units is in the data voltage writing state, the emission control signal received by the one of the pixel units from the emission control line connected thereto is in a null state.

Yet another feature of the OLED display device is that when each of the first and second scan signals received by the one of the pixel units is at a high level, the one of the pixel units is in an emissive state, and the one of the pixel units in the emissive state receives and is controlled by the emission control signal from the emission control line connected thereto to activate the organic light-emitting diode of the one of the pixel units to emit light.

Still another feature of the OLED display device is that when the emission control signal received by the one of the pixel units in the emissive state is active, the pixel driving circuit of the one of the pixel units drives the organic light-emitting diode of the one of the pixel units to emit light.

Yet another feature of the OLED display device is that when the pixel driving circuit of the one of the pixel units drives the organic light-emitting diode of the one of the pixel units to emit light, a luminance of the pixel driving circuit of the one of the pixel units is a function of the data voltage of the one of the pixel units.

Still another feature of the OLED display device is that when the emission control signal received by the one of the pixel units in the emissive state is in the null state, the organic light-emitting diode of the one of the pixel units is in an off state.

Yet another feature of the OLED display device is that the emission control signal received by the one of the plurality of pixel units is a periodical signal switching between the active state and the null state.

Still another feature of the OLED display device is that the active state of the emission control signal is a low level, and the null state of the emission control signal is a high level.

Yet another feature of the OLED display device is that the emission control signal is square waves.

Still another feature of the OLED display device is that the emission control signal has a duty cycle in a range of 0.5-0.9.

Yet another feature of the OLED display device is that one and only one row of pixel units is in the reset state during any moment of operation of the organic light-emitting diode display device.

Still another feature of the OLED display device is that one and only one row of pixel units is in the data voltage writing state during any moment of operation of the organic light-emitting diode display device.

The OLED display device according to the present invention uses two clock signals as the emission control signals for the OLED display device to replace the multiple emission control signals in the conventional technology. Thus, installation of emission control line driving circuits occupying a large area of the side frame of the OLED display device is not required. As a result, the technical solution of the present invention can effectively reduce the side frame width of the OLED display device.

The present invention will become clearer in light of the following detailed description of illustrative embodiments of this invention described in connection with the drawings.

DETAILED DESCRIPTION OF THE INVENTION

Figure 4:
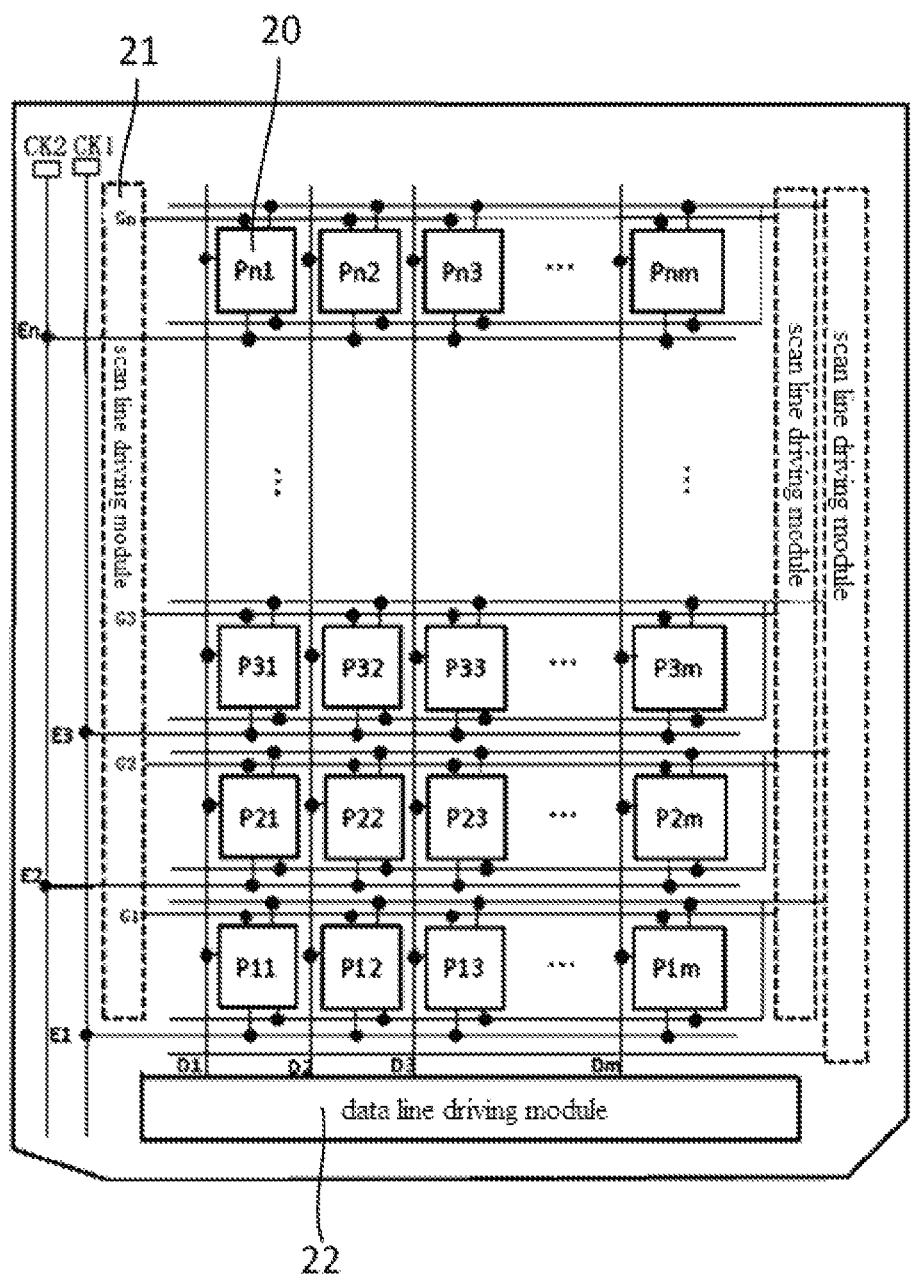
FIG. 4 is a schematic diagram of an organic light-emitting diode display device according to the present invention.

FIG. 4 is a schematic diagram of an organic light-emitting diode (OLED) display device according to the present invention. As shown in FIG. 4, the OLED display device according to the present invention includes an array of pixel units 20 having n rows and m columns. The pixel units 20 in each column of the array are connected to a data line $D_j$ (j is an integer ranging from 1 to m) providing a data voltage to the pixel units 20. The data line $D_j$ is driven by a data line driving module 22. The pixel units 20 in each row are connected to a first scan line $G_i$ and a second scan line $G_{i-1}$ (i is an integer ranging from 1 to n). The first scan line $G_i$ and the second scan line $G_{i-1}$ are driven by a scan line driving module 21. The pixel units 20 in each row are further connected to an emission control line $E_i$ (i is an integer ranging from 1 to n). The emission control line $E_i$ connected to the pixel units 20 in each odd-numbered row is connected to a first clock signal end CK1. The emission control line Ei connected to the pixel units 20 in each even-numbered row is connected to a second clock signal end CK2.

Figure 1:
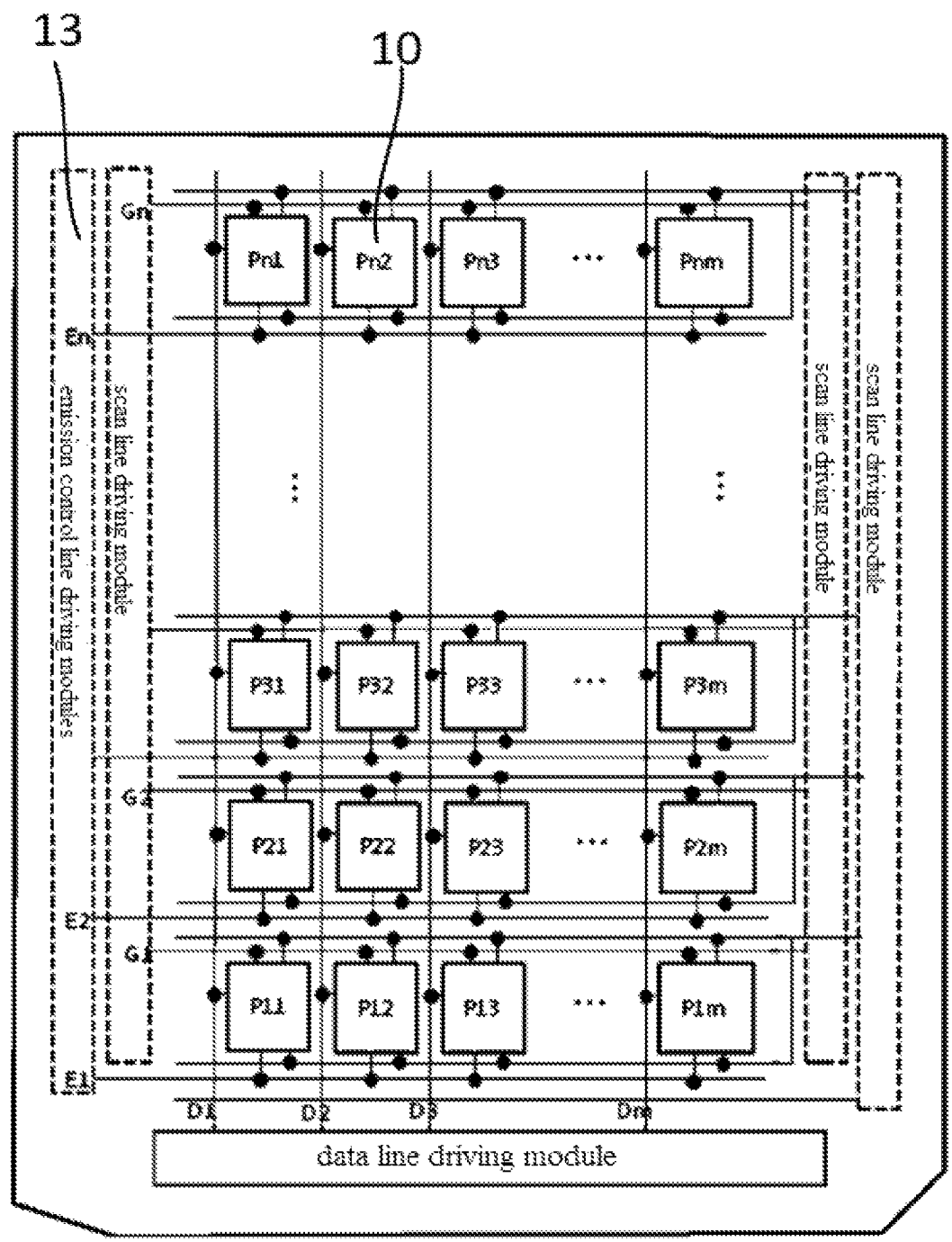
FIG. 1 is a schematic diagram of a conventional organic light-emitting diode display device.
Figure 2:
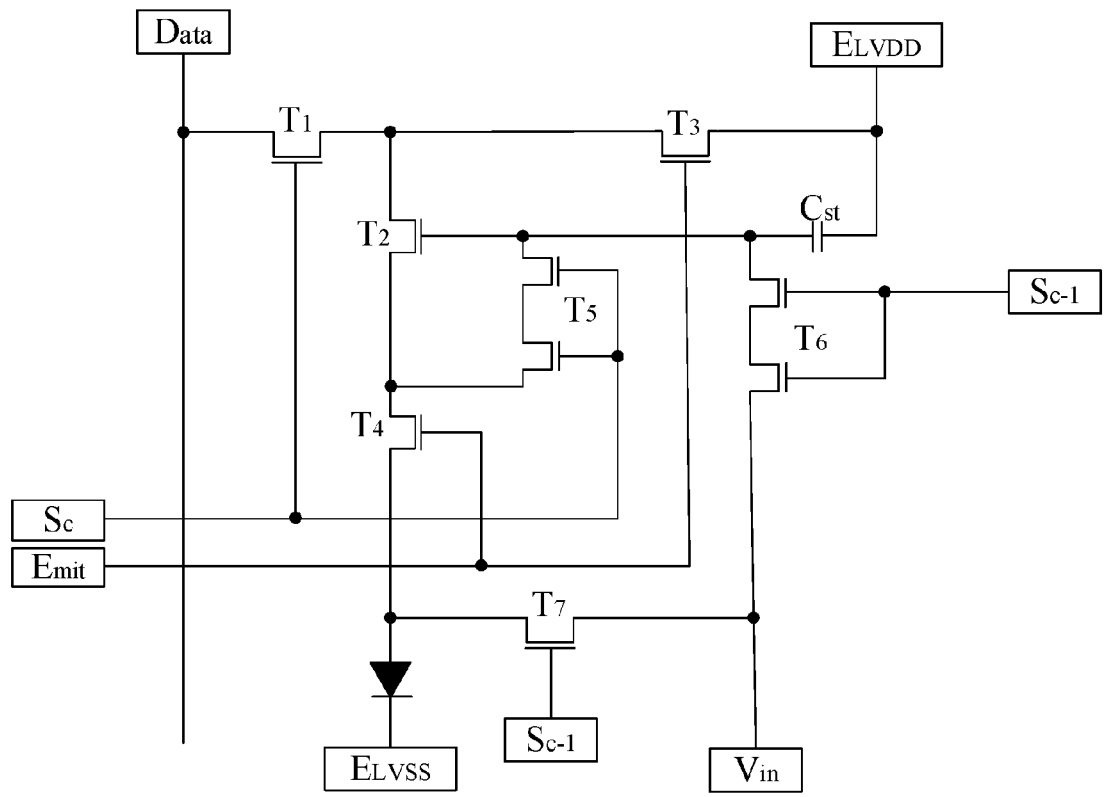
FIG. 2 is a diagram of a pixel driving circuit for a pixel unit.

FIG. 2 is a diagram of a pixel driving circuit for a pixel unit. The OLED display device of this embodiment can use such a pixel driving circuit. With reference to FIG. 2, the pixel unit includes the pixel driving circuit and an organic light-emitting diode (OLED). The pixel driving circuit includes a first scan end $S_c$, a second scan end $S_{c-1}$, an emission control end $E_{mit}$, and a data signal end $D_{ata}$. The pixel driving circuit is connected to the OLED in series. The first scan end $S_c$ of the pixel driving circuit is connected to the first scan line G. The second scan end $S_{c-1}$ of the pixel driving circuit is connected to the second scan line $G_{i-1}$. The data signal end $D_{ata}$ is connected to the data line $D_j$. The emission control end $E_{mit}$ is connected to the emission control line $E_i$.

Figure 5:
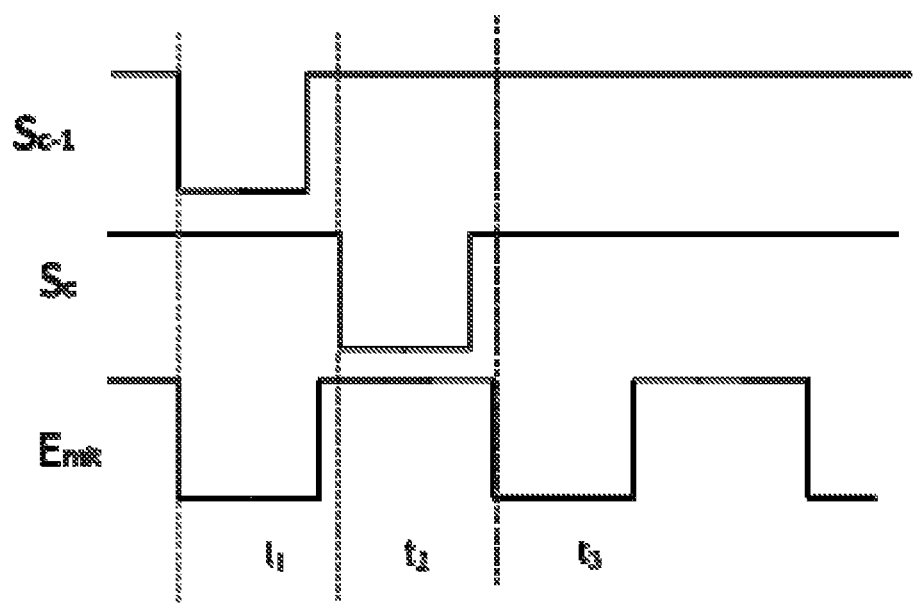
FIG. 5 is a waveform diagram of control signals of a pixel unit of the organic light-emitting diode display device according to the present invention during operation.

FIG. 5 is a waveform diagram of control signals of a pixel unit of an embodiment according to the present invention during operation. As shown in FIGS. 2 and 5, the pixel unit in this embodiment repeats the following three steps.

Figure 3:
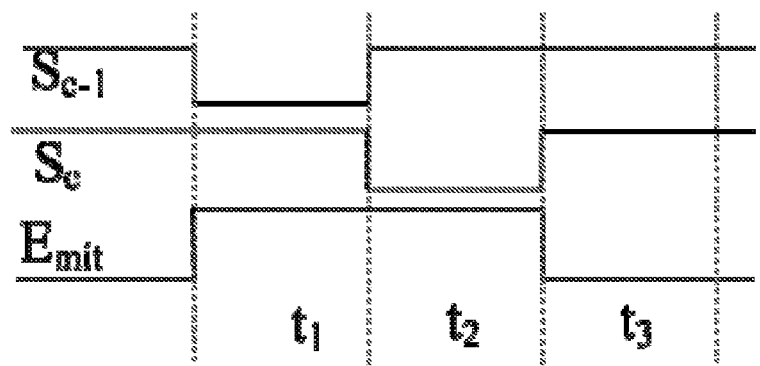
FIG. 3 is a waveform diagram of each control end of the pixel driving circuit of FIG. 2 during operation.

Step 1 is a reset procedure of the pixel unit 20 corresponding to t1 procedure in FIG. 5. During this procedure, a second scan signal received by the second scan end $S_{c-1}$ is at a low level, and the emission control signal received by the emission control end $E_{mit}$ is at a low level. A first scan signal received by the first scan end $S_c$ is at a high level. In this case, a first power $E_{LVDD}$ and a reset power $V_{in}$ charge a storage capacitor $C_{st}$. The pixel unit 20 enters a reset state under control by the second scan signal received by the second scan line $G_{i-1}$, and the data voltage stored in the storage capacitor $C_{st}$ of the pixel unit 20 in the reset state is cleared. During the reset procedure of this embodiment, the emission control signal received by the emission control end $E_{mit}$ is in an active state (low level), which is different from the conventional technology shown in FIG. 3. Thus, a third transistor $T_3$ and a fourth transistor $T_4$ become conductive. Nevertheless, normal operation of the pixel unit 20 will not be affected by the conduction of the third and fourth transistors $T_3$ and $T_4$ during the reset procedure of the pixel unit 20. A sixth transistor T6 and a seventh transistor T7 are also conductive under control of the second scan end $S_{c-1}$. Conduction of the seventh transistor T7 causes conduction between the reset power $V_{in}$ and an anode of the OLED. In this embodiment, the voltage of the reset power $V_{in}$ is −2V, and the voltage of a second power $E_{LVSS}$ connected to a cathode of the OLED is −3V. Therefore, the voltage on two ends of the OLED is smaller than the threshold voltage of the OLED in a forward conducting state. Thus, although the emission control signal at the emission control end $E_{mit}$ during the reset procedure of the pixel unit 20 is at a low level and in a null state, the OLED does not emit light during this procedure.

Step 2 is a voltage data writing procedure corresponding to t2 procedure in FIG. 5. In this case, the second scan signal received by the second scan end $S_{c-1}$ is at a high level, the emission control signal received by the emission control end Emit is at a high level, and the first scan signal received by the first scan end $S_c$ is at a high level. The pixel unit 20 enters a data voltage writing state under control by the first scan signal received by the first scan end $S_c$. During this procedure, the data signal end $D_{ata}$ of the pixel driving circuit receives the data voltage from the data line $D_j$ and stores the data voltage in the storage capacitor $C_{st}$. During the data voltage writing procedure, the emission control signal received by the emission control end Emit is in the null state. The pixel unit 20 further includes a driving transistor $T_2$. According to the properties of thin-film transistors (TFT), the data voltage containing the threshold voltage $V_{th}$ of the driving transistor $T_2$ can be stored in the storage capacitor $C_{st}$.

Step 3 is an emissive procedure corresponding to t3 procedure in FIG. 5. In this case, the first scan signal received by the first scan end Sc is at a high level, the second scan signal received by the second scan end Sc-1 is at a high level, and the pixel unit 20 enters an emissive state under control by the first and second scan signals. The emission control signal received by the emission control end $E_{mit}$ from the emission control line is square waves, such that the emission control signal periodically enters an active state. When the emission control signal is active, the pixel driving circuit of the pixel unit 20 in the emissive state activates the OLED of the pixel unit 20 to emit light. During this procedure, the data voltage stored in the storage capacitor $C_{st}$ and the threshold voltage Vth of the driving transistor $T_2$ are added to the gate of the driving transistor $T_2$. The emission control signal is in an active state when at a low level and is in a null state when at a high level. When the emission control signal is in the active state, the third transistor $T_3$ and the fourth transistor $T_4$ are conductive, and the magnitude of the current flowing between the source and the drain of the driving transistor $T_2$ is determined by the data voltage stored in the storage capacitor $C_{st}$. Since the magnitude of current flowing through the OLED is the same as the magnitude of the current flowing through the source and the drain of the driving transistor $T_2$, the luminance of the OLED is decided by the data voltage stored in the storage capacitor $C_{st}$ when the emission control signal is active. Conclusively, when the OLED emits light, the luminance of the OLED is a function of the data voltage stored in the storage capacitor $C_{st}$. When the emission control signal is in the null state, since the third transistor $T_3$ and the fourth transistor $T_4$ are in an off state, the current cannot flow through the driving transistor $T_2$ to the OLED, such that the OLED is in an OFF state. Thus, the OLED does not emit light when the emission control signal is null.

Figure 6:
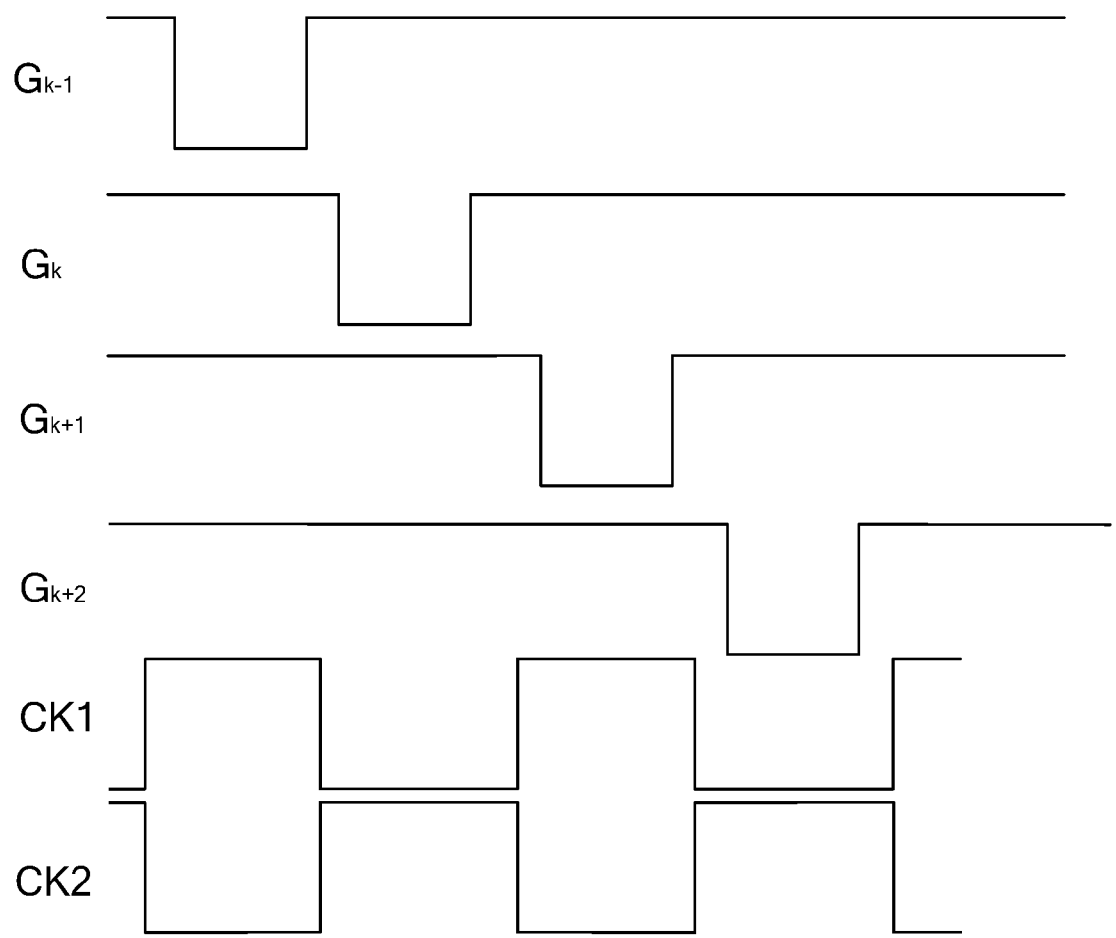
FIG. 6 is a waveform diagram of signals of a first scan line and an emission control line of the organic light-emitting diode display device according to the present invention during operation.

FIG. 6 is a waveform diagram of signals of the first scan line $G_i$ and the emission control line $E_i$ of the OLED display device according to the present invention during operation. As shown in FIGS. 5 and 6, during operation of the OLED display device, the pixel units 20 in any $k_{th}$ row of the OLED display device repeat the above three procedures. Overall, the first scan line $G_i$ of the OLED display device scans the pixel units 20 row by row and selects a row of pixel units 20. The pixel unit 20 selected by the first scan line $G_i$ is in the data voltage writing procedure. If the pixel units in the $k_{th}$ row are in the data voltage writing procedure, the pixel units 20 in the $k-1_{th}$ row are in the emissive procedure, and the pixel units 20 in the $k+1_{th}$ row are in the reset procedure. During any moment of operation of the OLED display device, one and only one row of pixel units 20 is in the reset state, one and only one row of pixel units 20 is in the data voltage writing state.

According to analysis on the waveforms shown in FIG. 6 and the above operation procedures of the pixel units 20, the emission control signal of the $k-1_{th}$ row of pixel units 20 and the $k+1_{th}$ row of pixel units 20 can use square waves having the same frequency and the same phase. Thus, in the OLED display device according to the present invention, the emission control line $E_i$ connected to the pixel units 20 in each odd-numbered row is connected to a first clock signal end CK1, and the emission control line Ei connected to the pixel units 20 in each even-numbered row is connected to a second clock signal end CK2. The phase difference between the emission control signals of two adjacent rows of pixel units 20 is a fixed angle in a range between 90° and 180°. Thus, the emission control signals outputted by the first and second clock signal ends CK1 and CK2 have the same frequency and have a phase difference which is an angle between 90° and 180°. In this embodiment, the phase difference is 180°. In the present invention, by using the first clock signal end CK1 and the second clock signal end CK2 as the driving ends of the emission control lines the OLED display device only has to provide the emission control lines $E_i$ with two emission control signals having a fixed phase difference therebetween, which greatly reduces the area occupied by the emission control line driving circuits and, thus, reduces the side frame width of the OLED display device.

According to analysis on the above pixel unit 20, the necessary condition of normal operation of the pixel unit 20 is that the emission control signal must remain in the null state (i.e., at a high level) during the data voltage writing procedure (step 2) of the pixel unit 20. To fulfill the necessary condition, the emission control signal at the emission control end $E_i$ of the pixel unit 20 does not have to be in the active state at other times. Thus, the duty cycle of the emission control signal can be controlled to adjust the total period of time of the emission control signal in the active state, thereby adjusting the luminance of the OLED display device. Due to limitation of the above necessary condition, the lower limit of the duty cycle of the emission control signal is 0.5. To assure the images of the OLED display device can be normally identified by the human eyes, the upper limit of the duty cycle of the emission control signal is 0.9. The gray scale of the OLED display device can be adjusted flexibly by adjusting the duty cycle of the emission control signal.

Thus since the illustrative embodiments disclosed herein may be embodied in other specific forms without departing from the spirit or general characteristics thereof, some of which forms have been indicated, the embodiments described herein are to be considered in all respects illustrative and not restrictive. The scope is to be indicated by the appended claims, rather than by the foregoing description, and all changes which come within the meaning and range of equivalency of the claims are intended to be embraced therein.

The invention claimed is:

1. An organic light-emitting diode display device comprising:
   an array of pixel units, with each of the pixel units including a pixel driving circuit and an organic light-emitting diode, with the pixel units in each column of the array connected to a data line providing a data voltage to the pixel units, with the pixel units in each row of the array connected to a first scan line for selecting and activating the pixel units to receive the data voltage, with the pixel units in each row of the array connected to a second scan line for selecting and resetting the pixel units,
   wherein the pixel units in each row are connected to an emission control line that sends an emission control signal to the pixel units,
   wherein the emission control line connected to the pixel units in each odd-numbered row of the array is connected to a first clock signal end,
   wherein the emission control line connected to the pixel units in each even-numbered row of the array is connected to a second clock signal end, and
   wherein two emission control signals outputted by the first and second clock signal ends have a same period and have a stable phase difference between 90° and 180°;
   wherein each pixel unit enters a reset state under control by a second scan signal provided by the second scan line, and wherein the data voltage stored in each pixel unit in the reset state is cleared.

2. The organic light-emitting diode display device according to claim 1, wherein when the second scan signal provided by the second scan line is at a low level, each of the pixel units selected by the second scan line enters the reset state.

3. The organic light-emitting diode display device according to claim 2, wherein when one of the pixel units is in the reset state, the emission control signal received by the one of the pixel units from the emission control line connected thereto is in an active state.

4. The organic light-emitting diode display device according to claim 3, wherein when one of the pixel units is in the reset state, the voltage at two ends of the organic light-emitting diode of the one of the pixel units is smaller than a conductive threshold voltage of the organic light-emitting diode.

5. The organic light-emitting diode display device according to claim 1, wherein each pixel unit enters a data voltage writing state under control by a first scan signal provided by the first scan line, and wherein each pixel unit in the data voltage writing state receives and stores the data voltage provided by the data line connected thereto.

6. The organic light-emitting diode display device according to claim 5, wherein the pixel driving circuit of each pixel unit further includes a storage capacitor, and wherein each pixel unit stores the data voltage from the data line in the storage capacitor thereof.

7. The organic light-emitting diode display device according to claim 6, wherein the pixel driving circuit of each pixel unit further includes a driving transistor, and wherein when each pixel unit is in a data voltage writing procedure, the data voltage containing a threshold voltage of the driving transistor is stored in the storage capacitor thereof.

8. The organic light-emitting diode display device according to claim 5, wherein when the first scan signal provided by the first scan line is at a low level, each pixel unit selected by the first scan line enters the data voltage writing state.

9. The organic light-emitting diode display device according to claim 5, wherein when one of the pixel units is in the data voltage writing state, the emission control signal received by the one of the pixel units from the emission control line connected thereto is in a null state.

10. The organic light-emitting diode display device according to claim 5, wherein when each of the first and second scan signals received by the one of the pixel units is at a high level, the one of the pixel units is in an emissive state, and wherein the one of the pixel units in the emissive state receives and is controlled by the emission control signal from the emission control line connected thereto to activate the organic light-emitting diode of the one of the pixel units to emit light.

11. The organic light-emitting diode display device according to claim 10, wherein when the emission control signal received by the one of the pixel units in the emissive state is active, the pixel driving circuit of the one of the pixel units drives the organic light-emitting diode of the one of the pixel units to emit light.

12. The organic light-emitting diode display device according to claim 11, wherein when the pixel driving circuit of the one of the pixel units drives the organic light-emitting diode of the one of the pixel units to emit light, a luminance of the pixel driving circuit of the one of the pixel units is a function of the data voltage of the one of the pixel units.

13. The organic light-emitting diode display device according to claim 11, wherein when the emission control signal received by the one of the pixel units in the emissive state is in the null state, the organic light-emitting diode of the one of the pixel units is in an off state.

14. The organic light-emitting diode display device according to claim 13, wherein the emission control signal received by the one of the pixel units is a periodical signal switching between the active state and the null state.

15. The organic light-emitting diode display device according to claim 5, wherein one and only one row of pixel units is in the data voltage writing state during any moment of operation of the organic light-emitting diode display device.

16. The organic light-emitting diode display device according to claim 1, wherein the active state of the emission control signal is a low level, and the null state of the emission control signal is a high level.

17. The organic light-emitting diode display device according to claim 16, wherein the emission control signal is square waves.

18. The organic light-emitting diode display device according to claim 17, wherein the emission control signal has a duty cycle in a range of 0.5-0.9.

19. The organic light-emitting diode display device according to claim 1, wherein one and only one row of pixel units is in the reset state during any moment of operation of the organic light-emitting diode display device.

* * * * *